United States Patent [19]

Kendall et al.

[11] Patent Number: 4,731,848

[45] Date of Patent: Mar. 15, 1988

[54] SPATIAL REVERBERATOR

[75] Inventors: Gary Kendall; William Martens, both of Evanston, Ill.

[73] Assignee: Northwestern University, Evanston, Ill.

[21] Appl. No.: 663,229

[22] Filed: Oct. 22, 1984

[51] Int. Cl.[4] .................... H03G 3/00

[52] U.S. Cl. .................... 381/63; 84/DIG. 26

[58] Field of Search .................... 381/1, 17, 18, 19, 62, 381/63; 84/DIG. 4, DIG. 26

[56] References Cited

U.S. PATENT DOCUMENTS

| | | | |
|---|---|---|---|
| 4,188,504 | 2/1980 | Kasuga et al. | 381/17 |
| 4,192,969 | 3/1980 | Iwahara | 381/1 |
| 4,219,696 | 8/1980 | Kogure et al. | 381/1 |
| 4,237,343 | 12/1980 | Kurtin et al. | 381/63 |
| 4,338,581 | 7/1982 | Morgan | 381/63 |
| 4,366,346 | 12/1982 | Dijkmans et al. | 381/63 |
| 4,472,993 | 9/1984 | Futamase et al. | 381/63 |

OTHER PUBLICATIONS

Chamberlin, Musical Applications of Microprocessors, 1980, pp. 462–467.

P. Jeffrey Bloom, Creating Source Elevation Illusions by Spectral Manipulation, Sep. 1977, J. Audio Eng. Soc., vol. 25, No. 9.

John M. Chowning, The Simulation of Moving Sound Sources, Jan. 1971, J. Audio Eng. Soc., vol. 19, No. 1.

T. Mori, G. Fujiki, N. Takahashi, F. Maruyama, Precision Sound Image-Localization Technique Utilizing Multitrack Tape Masters, J. Audio Eng. Soc., Jan.-/Feb., 1979, vol. 27, No. ½.

N. Sakamoto, T. Gotoh, T. Kogure, M. Shimbo and Almon H. Clegg, Controlling Sound-Image Localization in Stereophonic Reproduction, J. Audio Eng. Soc., Nov. 1981, vol. 29, No. 11.

N. Sakamoto, T. Gotoh, T. Kogure, M. Shimbo, A. Clegg, Controlling Sound-Image Localization in Stereophonic Reproduction: Part II*, J. Audio Eng. Soc., Oct. 1982, vol. 30, No. 10.

M. R. Schroeder, Natural Sounding Artificial Reverberation, J. Acoustical Soc. Amer., Jul. 1962, vol. 10, No. 3.

John Stautner and Miller Puckette, Designing Multi--Channel Reverberators, Computer Music Journal, 1982, vol. 6, No. 1.

*Primary Examiner*—Forester W. Isen
*Attorney, Agent, or Firm*—Welsh & Katz, Ltd.

[57] ABSTRACT

A method and apparatus for processing audio signals utilizing reverberation in combination with directional cues to capture both the temporal and spatial dimensions of a three-dimensional natural reverberant environment. Reverberant streams are generated and directionalized to simulate a selected model environment utilizing pinna cues and other directional cues to simulate reflected sound from various spatial regions of the model environment.

47 Claims, 11 Drawing Figures

FIG-1
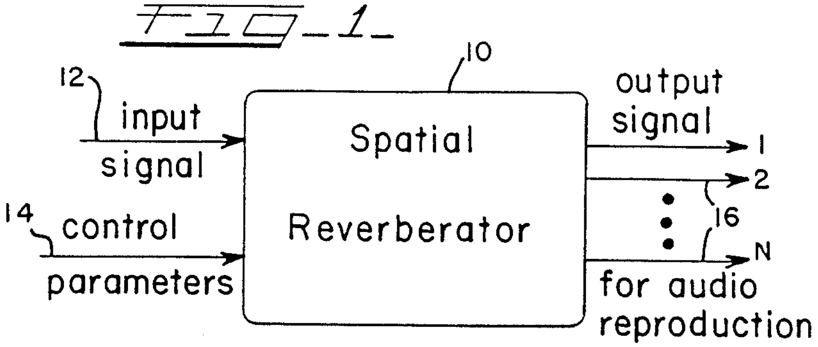
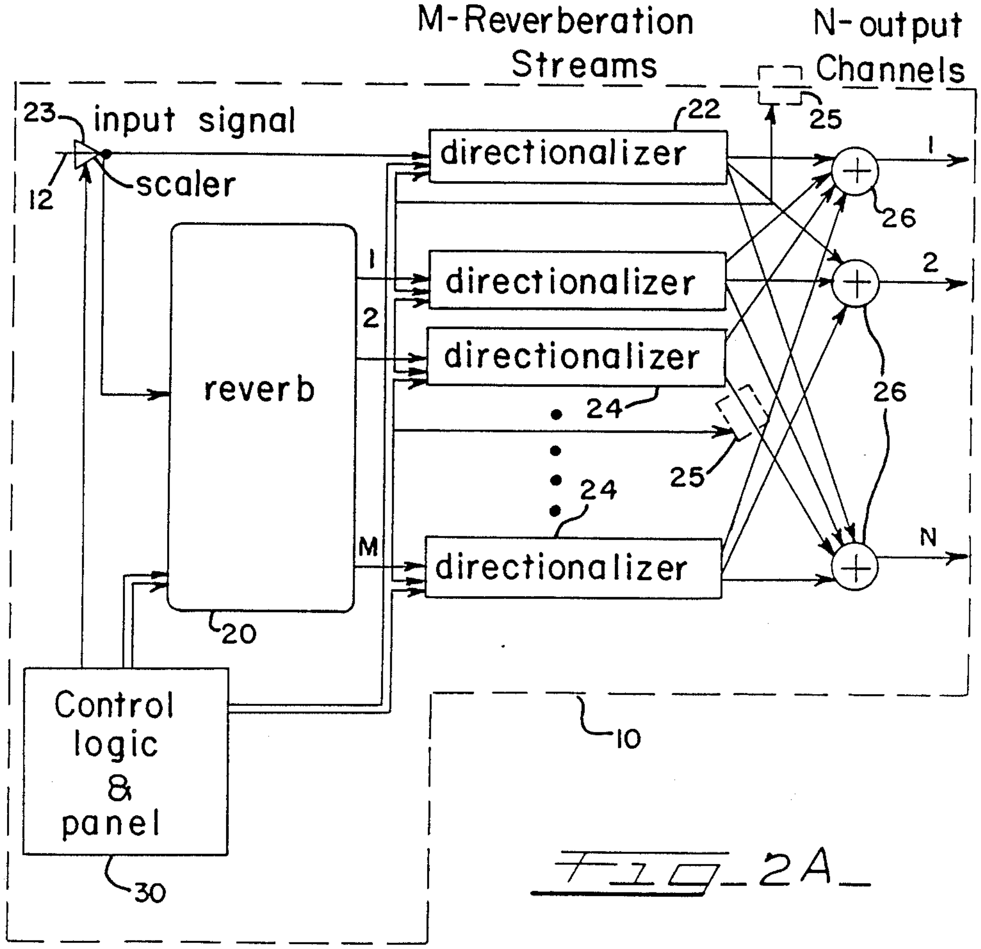
FIG-2A

FIG. 3C
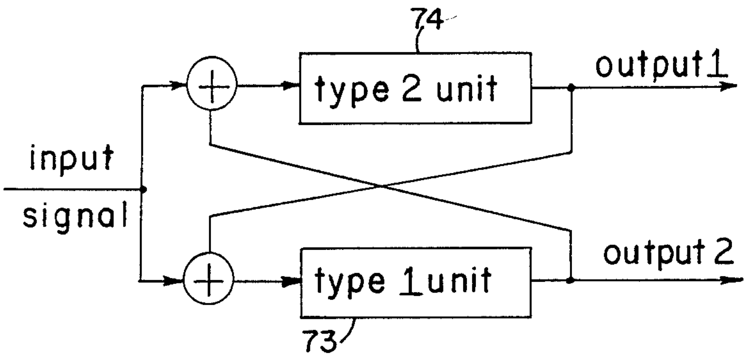
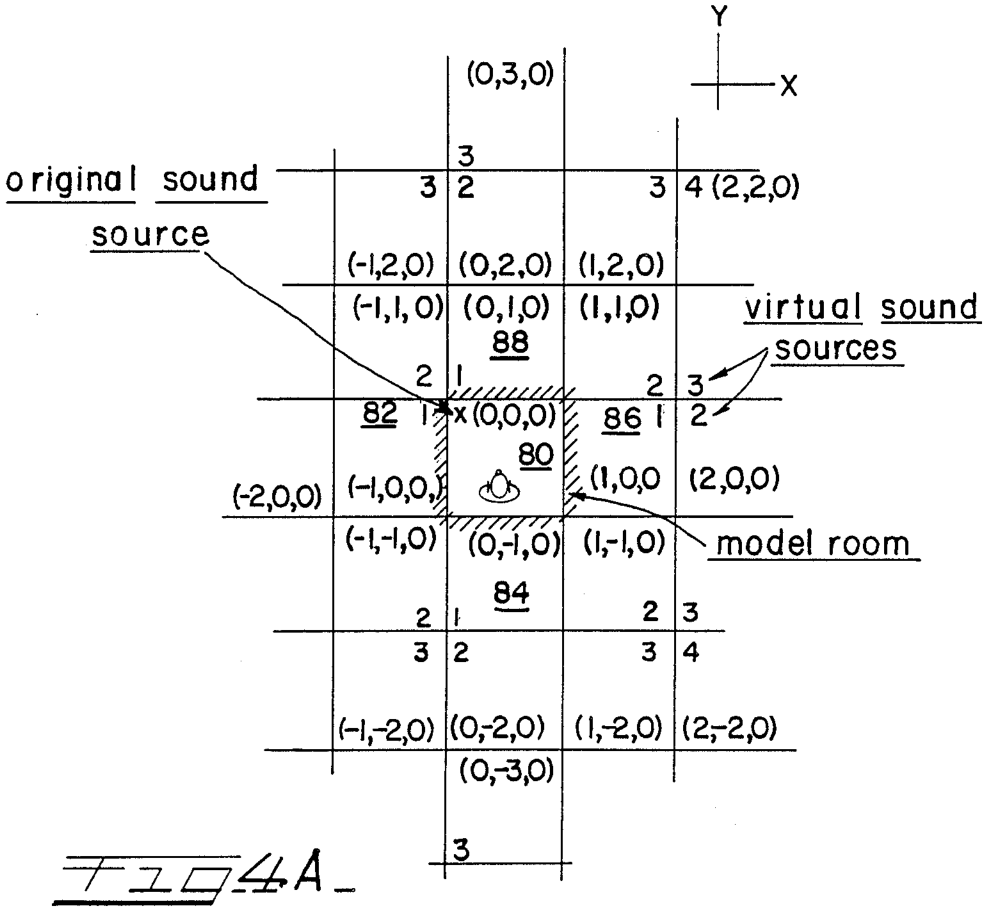
FIG. 4A

SPATIAL REVERBERATOR

This invention relates generally to the field of acoustics and more particularly to a method and apparatus for reverberant sound processing and reproduction which captures bother the temporal and spatial dimensions of a threee-dimensional natural reverberant environment.

A natural sound environment comprises a continuum of sound source locations including direct signals from the location of the sources and indirect reverberant signals reflected from the surrounding environment. Reflected sounds are most notable in the concert hall environment in which many echoes reflected from various different surfaces in the room producing the impression of space to the listener. This effect can vary in evoked subjective responses, for example, in an auditorium environment it produces the sensation of being surrounded by the music. Most music heard in modern times is either in the comfort of one's home or in an auditorium and for this reason most modern recorded music has some reverberation added before distribution either by a natural process (i.e., recordings made in concert halls) or by artificial processes (such as electronic reverberation techniques).

When a sound event is transduced into electrical signals and reproduced over loudspeakers and headphones, the experience of the sound event is altered dramatically due to the loss of information utilized by the auditory system to determine the spatial location of the sound events (i e., direction and distance cues) and due to the loss of the directional aspects of reflected (i.e., reverberant) sounds. In the prior art, multi-channel recording and reproduction techniques including reverberation from the natural environment retain some spatial information, but these techniques do not recreate the spatial sound field of a natural environment and therefore create a listening experience which is spatially impoverished.

A variety of prior art reverberation systems are available which artificially create some of the attributes of natural occurring reverberation and thereby provide some distance cues and room information (i.e., size, shape, materials, etc.,). These existing reverberation techniques produce multiple delayed echoes by means of delay circuits, many providing recirculating delays using feedback loops. A number of refinements have been developed including a technique for simulating the movement of sound sources in a reverberant space by manipulating the balance between direct and reflected sound in order to provide the listener with realistic cues as to the perceived distance of the sound source. Another approach simulates the way in which natural reverberation becomes increasingly low pass with time as the result of the absorption of high frequency sounds by the air and reflecting surfaces. This technique utilizes low pass filters in the feedback loop of the reverberation unit to produce the low pass effect.

Despite these improved techniques existing reverberation systems fail in their efforts to simulate real room acoustics resulting in simulated room reverberation that does not sound like real rooms. This is partially due to the fact that these techniques attempt to replicate an overall reverberation typical of large reverberant rooms thereby passing up the opportunity to utilize the full range of possible applications of sound processing applying to many different types of music and natural environments. In addition, these existing approaches attempt only to capture general characteristics of reverberation in large rooms without attempting to replicate any of the exact characteristics that distinguish one room from another, and they do not attempt to make provisions for dynamic changes in the location of the sound source or the listener, thus not effectively modeling the dynamic possibility of a natural room environment. In addition, these methods are intended for use in conventional stereo reproduction and make no attempt to localize or spatially separate the reverberant sound. One improved technique of reverberation attempts to capture the distribution of reflected sound in a real room by providing each output channel with reverberation that is statistically similar to that coming from part of a reverberant room. Most of these contemporary approaches to simulate reverberation treat reverberation as totally independent of the location of the sound source within the room and are therefore only suited to simulating large rooms. Furthermore, these approaches provide incomplete spatial cues which produces an unrealistic illusory environment.

In addition to reverberation which provides essential elements of spatial cues and distance cues, much pschyo-acoustic development and research has been done into directional cues which include primarily interaural time differences (i.e. different time of arrival at the two ears), low pass shadow effect of the head, pinna transfer functions, and head and torso related transfer functions. This research has largely been confined to efforts to study each of these cues as independent mechanisms in an effort to understand the auditory system's mechanisms for spatial hearing.

Pinna cues are particularly important cues to determine directionality. It has been found that one ear can provide information to localize sound and even the elevation of sound source can be determined under controlled conditions where the head is restricted and reflections are restricted. The pinna, which is the exposed part of the external ear, has been shown to be the source of these cues. The ear's pinna performs a transform on the sound by a physical action on the incident sound causing specific spectral modifications unique to each direction. Thereby directional information is encoded into the signal reaching the ear drum. The auditory system is then capable of detecting and recognizing these modifications, thus decoding the directional information. The imposition of pinna transfer functions on a sound stream have shown that directional information is conveyed to a listener in an anechoic chamber. Prior art efforts to use pinna cues and other directional cues have succeeded only in directionalizing a sound source but not in localizing (i.e., both direction and distance) the sound source in three-dimensional space.

However, when imposing pinna transfer functions on a sound stream which is reproduced in a natural environment, the projected sound paths are deformed. This is the result of the fact that the directional cues are altered by the acoustics of the listening environment, particularly as a result of the pattern of the reflected sounds. The reflected sound of the listening environment creates conflicting locational cues, thus altering the perceived direction and the sound image quality. This is due to the fact that the auditory system tends to combine the conflicting and the natural cues evaluating all available auditory information together to form a composite spatial image.

It is accordingly an object of this invention to provide a method and apparatus to simulate reflected sound along with pinna cues imposed upon the reflected sound in a manner so as to overwhelm the characteristics of the actual listening environment to create a selected spatio-temporal distribution of reflected sound.

It is another object of the invention to provide a method and apparatus to utilize spectral cues to localize both the direct sound source and its reverberation in such a way as to capture the perceptual features of a three-dimensional listening environment.

It is another object of the invention to provide a method and apparatus for producing a realistic illusion of three-dimensional localization of sound source utilizing a combination of directional cues and controlled reverberation.

It is another object of the invention to provide a novel audio processing method and apparatus capable of controlling sound presence and definition independently.

Briefly, according to one embodiment of the invention, an audio signal processing method is provided comprising the steps of generating at least one reverberant stream of audio signals simulating a desired configuration of reflected sound and superimposing at least one pinna directional cue on at least one part of one reverberant stream. In addition, sound processing apparatus are provided for creating illusory sound sources in three-dimensional space. The apparatus comprises an input for receiving input audio signals and reverberation means for generating at least one reverberant stream of audio signals from the input audio signals to simulate a desired configuration of reflected sound. A directionalizing means is also provided for applying to at least part of one reverberant stream a pinna transfer function to generate at least one output signal.

BRIEF DESCRIPTION OF THE DRAWINGS

The invention, together with further objects and advantages thereof, may be understood by reference to the following description taken in conjunction with the accompanying drawings.

FIG. 1 is a generalized block diagram illustrating a specific embodiment of a spatial reverberator system according to the invention.

FIG. 2A is a block diagram illustrating a specific embodiment of a modular spatial reverberator having M reverberation streams according to the invention.

FIG. 3C is block diagram illustrating parallel reverberation units utilizing feedback.

FIG. 4A is an image model of a top view of the horizontal plane of a rectangular room.

DETAILED DESCRIPTION OF THE PREFERRED EMBODIMENT

Figure 2B:
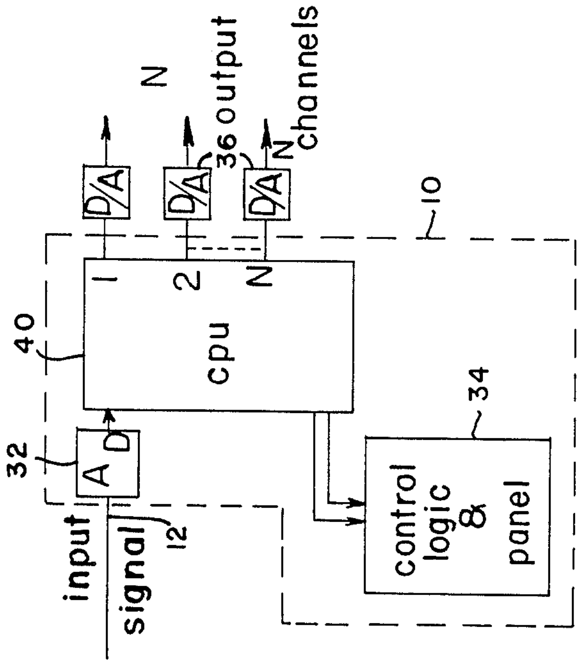
FIG. 2B is a block diagram illustrating a specific embodiment of a spatial reverberation system utilizing a computer to process signals.

FIG. 1 is a generalized block diagram illustrating a spatial reverberator 10 according to the invention. Input audio signals are supplied to the spatial reverberator via an input 12 and processed under the control of the spatial reverberator in response to control parameters applied to the spatial reverberator 10 via an input 14. The spatial reverberator 10 processes the sound input signals to produce a set of output signals for audio reproduction or recording at the spatial reverberator outputs 16, as shown. The spatial reverberator 10 processes the sound input signal applied to the input 12 such that when the output signals are reproduced, an illusory experience is created of being within a natural acoustic environment by creating the perception of reflected sound coming from all around in a natural manner. Thus, the spatial reverberator creates the illusion of sound coming from many different directions in three-dimensional space. This is done by using synthesized directional cues superimposed (i.e. superimposing directionalizing transfer functions) on reverberant sound to create the illusion of reflections from many directions.

As is generally known in the art, the pinna of the outer ear modifies sound impinging upon it so as to provide spectral changes thereby providing spectral cues for sound direction. In addition, other cues provide information to the auditory system to aid in determining the direction of a sound source, such as the shadow effect of the head which occurs when sound on one side of the head is shadowed relative to the ear on the other side of the head for frequencies in which the wavelength of the sound is shorter than the diameter of the head. Other similar effects providing directional cues are those caused by reflection of sound off the upper torso, shoulders, head, etc., as well as differences in the time of arrival of a sound between one ear and the other. By simulating these natural directional cues, the spatial reverberator is able to fool the auditory system into ignoring the fact that the sound comes from the location of a speaker, and to create the illusion of three-dimensional sound space. This is possible since the auditory system integrates spectral cues for sound direction (i.e. spectral directional cues) with locational cues produced by reflected sound. Thus, the spectral cues are used to directionalize reverberation and distribute it in space in such as way as to simulate the acoustics of a three-dimensional room and so as to avoid creating unnatural and conflicting spatial cues.

The superimposition of spectral directional cues upon reverberation improves the simulation of sound source location and provides a mechanism for controlling a number of subjective qualities associated with the location of a sound source but independent of the location. Two of the most important such subjective qualities associated with room acoustics are "presence" and "definition." Generally speaking, definition is the perceptual quality of the sound source, while presence refers to the quality of the listening environment. High definition occurs when sound sources are well focused and located in space. Good presence occurs when the listener perceives himself to be surrounded by the sound and the reverberation seems to come from all directions.

These two subjective qualities have substantial bearing on the esthetic value of a sound reproduction. Most studies, however, have found that optimal presence and definition are mutually exclusive, that is, improving the sense of sound presence also diminishes the sense of positional definition. The spatial reverberator 10 provides independent control over presence and definition. This is possible because not all reflected sound contributes to the quality of presence in the same way. Lateral reflections are necessary for producing good presence while definition is degraded by lateral reflections. Presence of only nonlateral reflections improves the impression of definition. That is, lateral reflections create low interaural cross-correlation and support good presence, while ceiling reflections retain a high interaural cross-correlation and support good definition. Thus, by using the spatial reverberator 10 to simulate a reverberant room with dominant early reflections from lateral walls, good presence can be created at the expense of high definition. If emphasis is given to the ceiling reflections, then high definition can be reinforced. High definition and good presence can also be emphasized at the same time. For example, the lateral reflections can be low pass filtered providing good presence, while also permitting unfiltered ceiling reflections to support high definition. This permits audio reproduction with esthetic values that could not be achieved in a natural physical environment.

Also, current approaches to simulating reverberation generally treat reverberation as totally independent of the location of the sound source within the room, and therefore are suited to simulating very large rooms where this is assumption is approximately true. The spatial reverberator 10 takes into account the location of both the sources and listener and is capable of simulating all listening environments.

Since directional cues such as pinna cues cannot alone provide total control of perceived direction because perceived direction is the result of the auditory system combining all available cues to produce a single locational image, the spatial reverberator must overcome or control the reflected sound present in the listening environment. This is accomplished by simulating reflected sound along with directional cues such as pinna cues in such a way as to overwhelm the perceptual affect of the natural environment. The spatial reverberator 10 can emphasize (e.g., increased amplitude, emphasis of certain frequencies, etc.) first order reflections so as to mask reflections in the actual listening environment.

In order to determine the pattern formed by sound reflected off the walls of a room, each reflected sound image is viewed as emanating from a unique virtual source outside the room. This is referred to as the image model. The particular pattern formed by the reflected sound provides locational information about the position of the sound source in the environment, especially when the sound source begins to move. This dynamic locational information from the environment is especially important when static locational cues are weak. Further, because the simulation parameters in the spatial reverberator 10 can be dynamically changed, it is possible to simulate the exact changes in the spatio-temporal distribution of the reverberation associated with a moving sound source, a moving listener or a changing room. Thus, the spatial reverberator 10 can accurately model an actual room and accurately create the perceptual qualities of a moving source or listener.

The lengths of the delay paths for determining the simulated reflected sounds can be calculated from the room dimensions and the listener's position in the room so as to give an accurate replication of the arrival time of the first, second and third order reflections. Subsequent reflections are determined statistically in terms of both spatial and temporal placement so that the evolution of the reverberation is captured. Each of the reverberation channels is separably directionalized using pinna transfer functions as well as other directional cues so as to produce spatially positioned reverberation streams.

Referring now to FIG. 2A, there is shown a block diagram illustrating specific subsystem organization for the spatial reverberator 10. This system may be implemented in many possible configurations, including a modular subsystem configuration, or a configuration implemented within a central computer using software based digital processing as illustrated in FIG. 2B. An audio signal to be processed by the spatial reverberator 10 is coupled from the input 12 through an amplitude scaler 23 and then to a reverberator subsystem 20 and to a first directionalizer 22, as shown. The amplitude scaler 23 may be a linear scaler to simulate the simple absorption characteristics of a natural environment or alternatively the scaler 23 may include low pass filtering to simulate the low-pass filtering nature of a natural sound environment.

The reverberator subsystem 20 processes the input signal to produce multiple outputs (1—M in the illustrated embodiment, where M may be any non zero integer), each of which is a different reverberation stream simulating the reflected sound coming to the listener from a different spatial region. The input signal is also processed by the directionalizer 22 which superimposes directional cues, preferably including pinna cues, on the input audio signal and produces an output for each output channel of the system representative of a direct (i.e., unreflected) sound signal. These directional cues in the preferred embodiment include using synthesized pinna transfer functions to directionalize the audio signal. The reverberant streams produced by the reverberator 20 are audio signal streams containing multiple delayed signals representing simulation of a selected configuration of reflected sounds. Each stream is different and is coupled, as shown, to a separate directionalizer 24. The reverberator 20 uses known techniques to produce reverberant streams. Suitable directionalizers have been described in U.S. Pat. No. 4,219,696 issued Aug. 26, 1980, to Kogure, et al. which is hereby incorporated by reference.

The resulting directionalized output signals from the directionalizers 22, 24 are coupled, as shown, to N mixing circuits 26. Each mixing circuit 26 sums the signals coupled to it and produces a single reverberant audio output to be applied to a sound reproducing transducer, such as a loudspeaker or headphones. Alternatively, a filter circuit 25 may be selectively added to directionalizer inputs or outputs to permit such effects as enhanced presence and definition. Many configurations of this general organization can be implemented varying from a single output to any number of output channels. In a stereo or a binaural system, there would be only two output channels.

The characteristics of the sound environment and sound illusions created by the spatial reverberator 10 are controlled via a control panel 30. Control arguments and parameters can be entered via the control panel 30 such as room dimensions, absorption co-efficients, position of the listener and sound sources, etc. In addition, other psychological parameters such as indexes for presence and definition, for the amount of perceived reverberation, etc. may be specified through the control panel 30. The control panel 30 comprises conventional terminal devices such as a keyboard, joy stick, mouse, CRT, etc. which may be manipulated by the user for input of desired parameters. Control signals generated in response to the manipulation of the control panel devices are coupled, as shown, to the reverberator 20, the directionalizers 22 and 24, the scalers 23, and filters 25 thereby controlling these subsystems. The control signals for the reverberator 20 can include scale factors, time delays and filter parameters, while the control signals for the directionalizer 22, 24 can include azimuth angle and elevation and the signals for the scalers 23 and filters 25 can include scale factors and filter parameters.

The input signal coupled to the first directionalizer subsystem 22 is modified to determine an illusory direction of the amplitude scaled and/or low-passed filtered non-reverberant input signal. The reverberator subsystem 20 processes the input signal to produce multiple audio reverberation streams each simulating a different temporal pattern of reflected sound coming to the listener from a different direction (i.e., different spatial region). These streams are coupled to different directionalizers which determine the illusory direction of each reverberation stream. The output signals from each directionalizer are mixed together to create a composite of the input signal and the directionalized reverberant streams which together simulate a three dimensional sound field. The directionalizer outputs may also be used directly, for example, they may be individually recorded on a multi-track recording system to permit an operation to experiment at a later time with various mixing schemes.

The number of separate output audio channels is determined by the number of channels available for sound reproduction (or recording) but for binaural listening there must be at least two in order to present different sound signals to the listener's left and right ears. For a stereo system, each directionalizer 23, 24 has two outputs, a right ear component and a left ear component of its directionalized audio sound stream. All the right ear components are then mixed together by a first mixer and all left ear components are mixed together by a second mixer to produce two composite output channels.

In the embodiment illustrated in FIG. 2B, each of the subsystems of FIG. 2A are implemented in software using conventional digital filtering, delay, and other known digital processing techniques. A computer program, written in the C programming language, for use with a system to simulate a rectangular room is provided in the attached Appendix A as part of this specification. The configuration of FIG. 2B includes an analog to digital (A/D) converter 32 for converting an input audio signal coupled to the input 12 to digital form to permit processing by the central processing unit (CPU) 40. The CPU 40 processes the signals as described above with regard to FIGS. 1 and 2A and generates output signals which are converted to analog form by the digital to analog (D/A) converters 36, as shown. The outputs for the CPU 40 may also be unmixed directionalized signals permitting multi-track recording for subsequent mixing. A control panel, as described above with reference to FIG. 2A is provided for input of control signals to control the illustrated spatial reverberator 10.

Figure 3A:
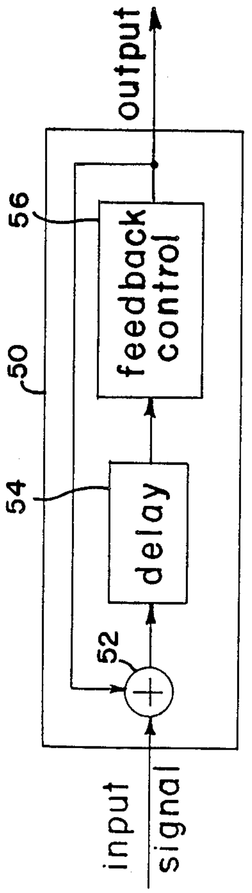
FIG. 3A is a block diagram illustrating a specific embodiment of a feedback delay buffer used as a reverberation subsystem.
Figure 3B:
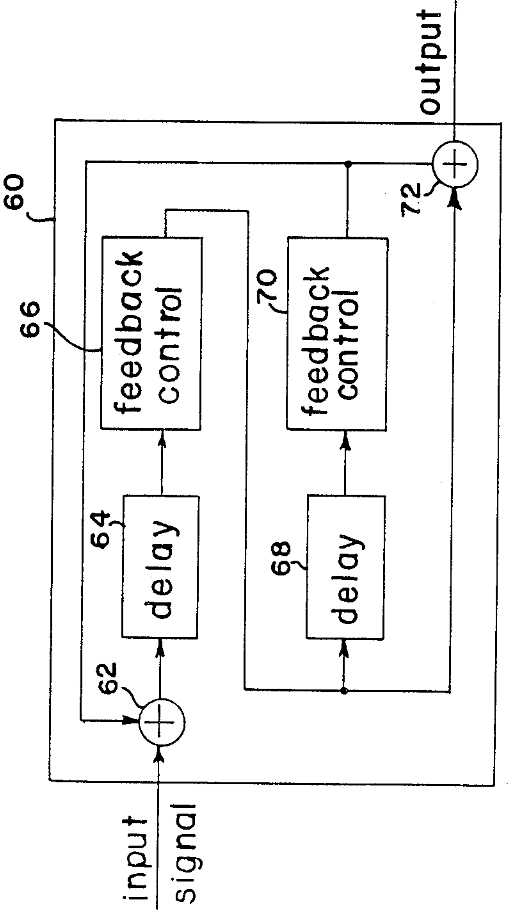
FIG. 3B is a block diagram illustrating a specific embodiment of a second delay feedback reverberation subsystem utilized by the invention.

Referring to FIGS. 3A and 3B, there is illustrated block diagrams of the two types of reverberation units used to implement the reverberation subsystem 20. Reverberation unit 50 shown in FIG. 3A (hereinafter referred to as a "type 1" unit) couples the input signal through a summing circuit 52 to a delay buffer 54 and feedback control circuit 56, which is placed at the end of the delay buffer 54, as shown. The output signal is fed back to the summing circuit 52 and is coupled to an output terminal 58, as shown. In one embodiment of this circuit, the feedback co-efficient is determined by a single-pole low pass filter that continuously modifies the recirculating feedback to simulate the low pass filtering effects of sound propagation through air.

The reverberation unit 60, shown in FIG. 3B (hereinafter referred to as a "type 2" unit) couples the input audio signal through a mixer 62 to a delay buffer 64 and a feedback circuit 66. The output of the feedback circuit 66 is coupled, as shown, to a second delay buffer 68 and a mixer 72. The output of the delay buffer 68 is coupled to a feedback control 70 the output of which is coupled to the mixer 72 and the mixer 62, as shown. In this type of reverberation unit 60, the actual feedback occurs after the second delay buffer 68 and its feedback control 70. Thus the output of the reverberation unit 60 is the sum of the outputs of each delay buffer feedback control pair. The type 2 units are most suitable for simulating a frequently occurring reverberation condition in which there is a repeating pattern of two different delays.

The feedback control of these reverberation units 50, 60, can take the form of multiplication by a single feedback co-efficient, a single-pole low pass filter, or filtering with a filter of unrestricted order. These feedback control systems effectively simulate absorption characteristics of the passage of sound through air and its reflection off walls. Use of a single multiplication captures the overall absorption of sound, while a low pass filter captures the frequency dependence of the absorption. In more complex implementations, a filter of unrestricted order can be used to capture other time and frequency dependent properties of sound absorption, reflection, and transmission.

To form a reverberation subsystem 20, type 1 and type 2 reverberation units are combined to create a system capable of producing multiple reverberation streams in parallel. To produce such parallel reverberation streams, type 1 and type 2 reverberation units are coupled in parallel with outputs of individual reverberation units fed back into the input of other individual units. The outputs of the individual parallel reverberation units can then be used as reverberation streams. FIG. 3C illustrates this concept showing a type 2 unit 74 and a parallel type 1 unit 73 with the output of each fed back into the input of the other to produce two reverberant streams. This mixing together of parallel reverberation unit outputs to produce one or more channels of reverberation streams produces a composite reverberant signal that has a rapidly increasing temporal density of reflections. This creates a more natural sounding result than that produced by reverberation units utilizing series combinations, even when directional cues are not superimposed as in a complete spatial reverberator.

Using this general approach, a spatial reverberator can be configured based upon the geometry of a selected room by simulating the early reflections of a simulated room and treating them as inputs to a reverberator with recirculating delays configured based upon the exact geometry of the room for which the early reflections were simulated. In addition, information concerning the incidence angles at which simulated reflections arrive is retained.

Figure 4C:
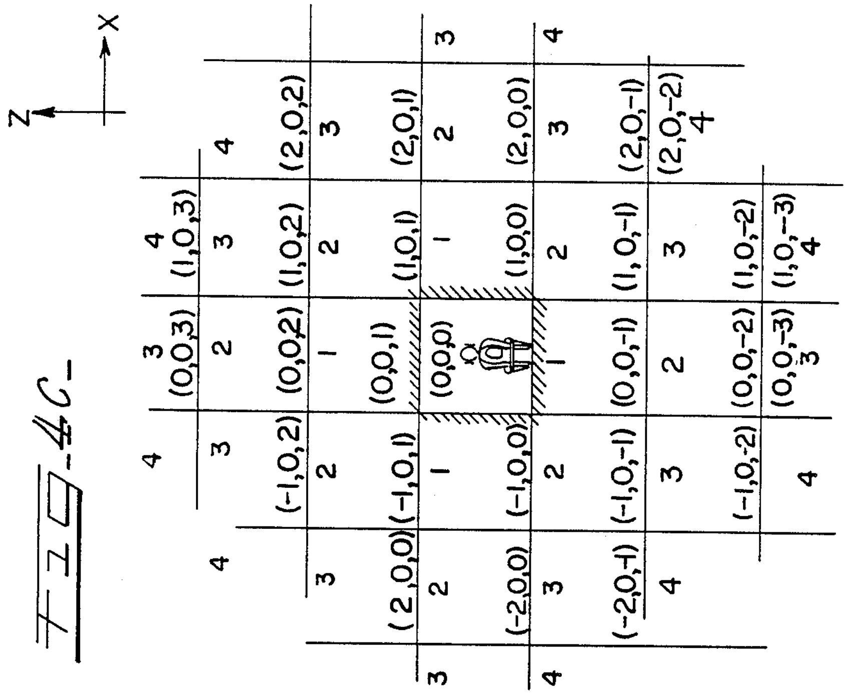
FIG. 4C is an image model of a rear view of the vertical plane of a rectangular room.
Figure 4B:
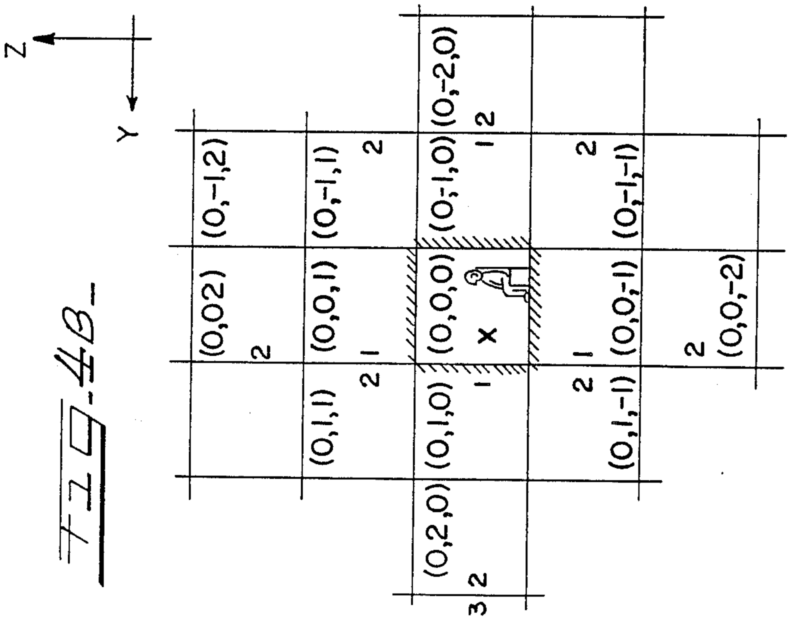
FIG. 4B is an image model of a side view of the vertical plane of a rectangular room.
Figure 5:
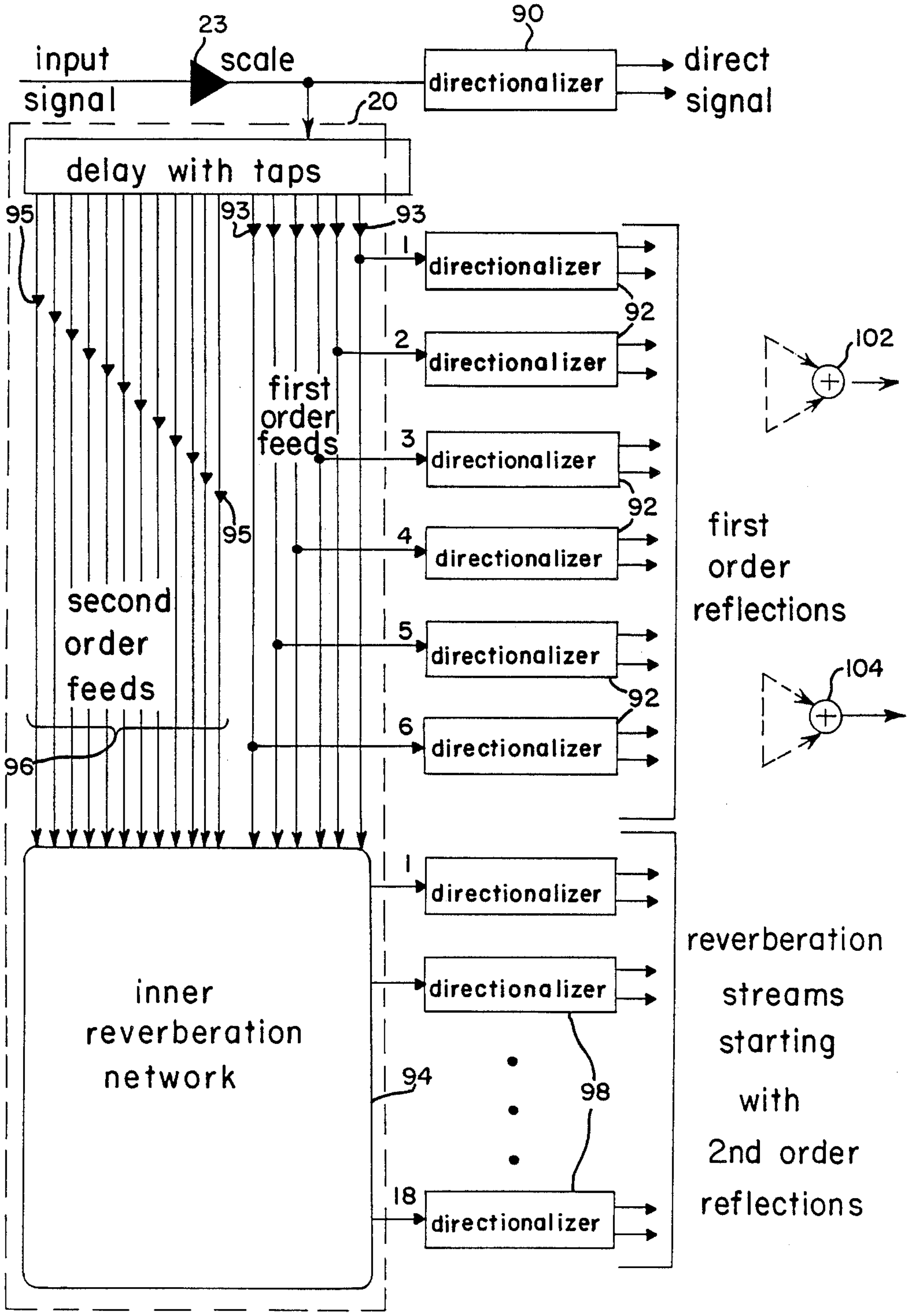
FIG. 5 is a detailed block diagram illustrating a spatial reverberator for simulating the acoustics of a rectangular room according to the invention.
Figure 6:
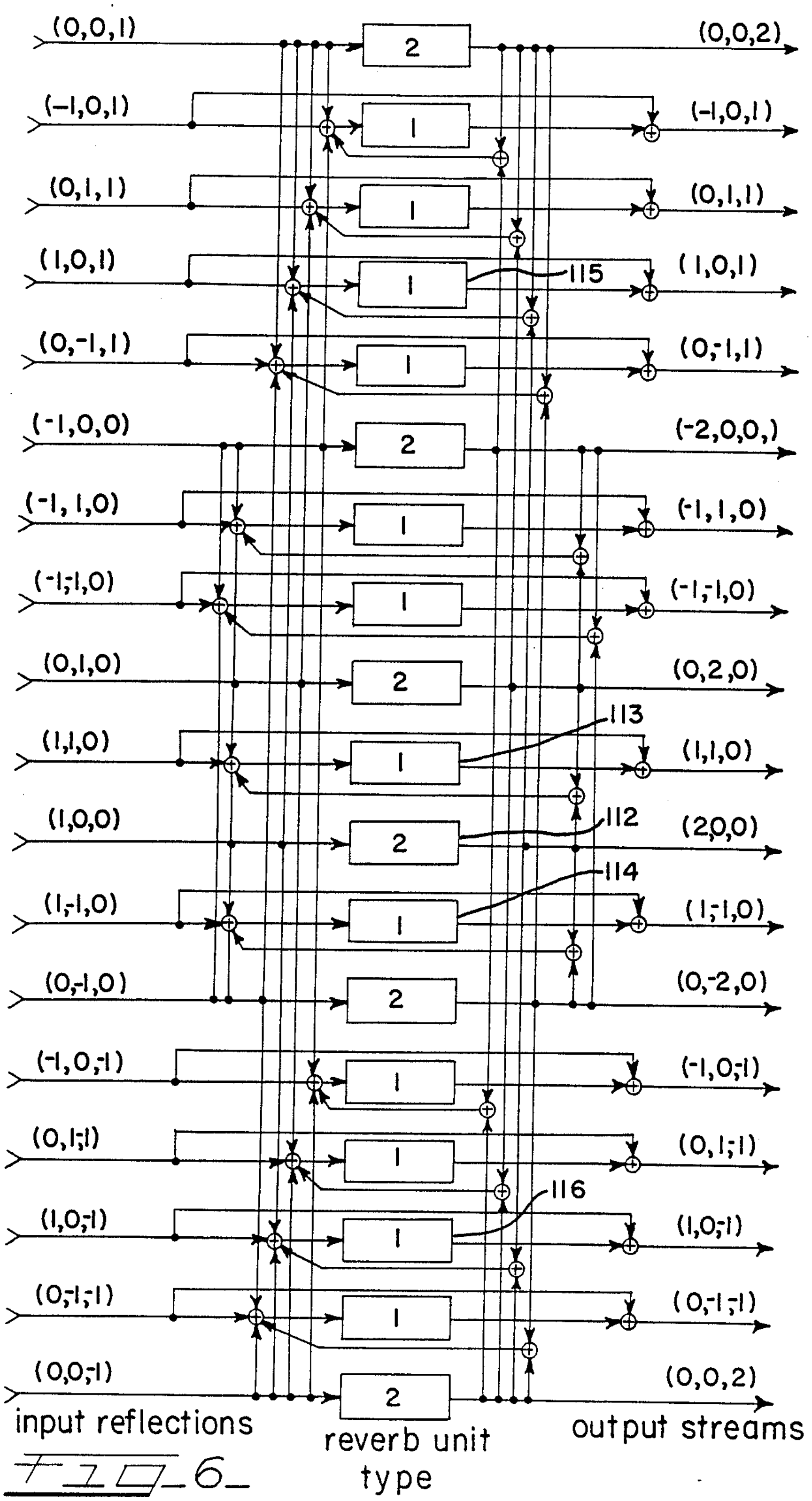
FIG. 6 is a detailed block diagram illustrating the inner reverberation network shown in FIG. 5.

A system configuration of a binaural spatial reverberator which accurately simulates the spatio-temporal reverberation pattern of a rectangular room is illustrated by FIGS. 5 and 6. The system simulates a rectangular room which is modeled using an image model for that room, as shown in FIGS. 4A, 4B and 4C. Image modeling is a known technique for modeling acoustic affects in a room which assumes that each reflected sound can be viewed as originating from a virtual sound source outside the actual physical room. Each virtual sound source is contained within a virtual room that duplicates the physical room (i.e., is a mirror image of the physical room).

In FIGS. 4A and 4B, integer X, Y, Z coordinates are used to specify virtual rooms. Thus, FIG. 4A shows the image model for the horizontal plane for a model rectangular room 80, with first order reflections (indicated by the virtual sources numbered as 1) modeled by virtual rooms 80, 84, 86, 88, and higher order reflections (indicated by virtual sources number 2, 3 and 4) represented by a grid of virtual rooms (i.e., sources) surrounding the actual source room 80. Similar grids of virtual rooms shown in FIGS. 4B and 4C illustrate the image model for the side view of the vertical plane and rear view of the vertical plane, respectively.

In FIGS. 4A, 4B, and 4C virtual room coordinates are shown for each virtual source and these coordinates are shown on FIGS. 5 and 6 to illustrate the correspondence between the reverberation network and each virtual source. It can be seen that the resulting spatial reverberator of FIGS. 5 and 6 will be accurate in space and time for first and second and some third order reflections. Reflections beyond the third order are statistically correct and are only near their exact spatio-temporal position.

A detailed block diagram of a binaural spatial reverberator for simulating a rectangular room (which is a specific embodiment of the general block diagram of FIG. 2A with the control system not shown) is shown in FIG. 5. The input audio signal to be processed is applied to the input 12 and coupled directly to an amplitude scaler 23, which may optionally be a low-pass filter, to scale the amplitude of the signal and thereby simulate sound absorption. This signal is then coupled to a directionalizer 90 which generates two different outputs of directionalized audio signals simulating direct sounds (i.e., non-reflected) which are coupled to the mixers 102 and 104, as indicated in FIG. 5. These two signals represent the right and the left ear components of the directionalized signal.

The input signal is also coupled to a multiple-tap delay circuit 92 within the reverberation subsystem 20. The delay circuit 92 produces six first order delayed audio signals with separate delays determined by the location of the listener in the room, location of the source in the room and the dimensions of the room. These six signals therefore represent the four first order reflections shown on the horizontal plane of FIG. 4A and the two first order reflections shown on the vertical plane of FIG. 4B. These six first order reflection signals are attenuated by scalers (or filters) 93 coupled as shown to six directionalizer circuits 92 which directionalize each attenuated first order reflection. The exact direction of each reflection is computed from the position of the listener in the model room and the position of the virtual sound sources as shown in FIGS. 4A, 4B, and 4C. The single delay buffer with multiple taps 92 thus serves to properly place these reflections in time. The distance between the listener's position and the position of the first order virtual sound sources (see FIGS. 4A, 4B, and 4C) is utilized to compute the time delay and the amplitude of the simulated reflection. By reference to FIGS. 4A. 4B, and 4C it can be seen that the first order virtual sources are contained in the virtual rooms having the coordinates (1, 0, 0), (0, 1, 0), (−1, 0, 0), (0, −1, 0), (0, 0, 1), (0, 0, −1).

Amplitude scaling and/or filtering is used to take into account the overall absorption of sound for each reflection by scaling (and/or filtering) each reflection to the correct amplitude using a multiplication coefficient or low-pass filter representative of the signal absorption. The resulting signal is passed into a directionalizer 92 where the signal is processed to superimpose directional cues, including pinna cues, to provide the directional characteristics to each reverberation stream. Each directionalizer 92 produces two output signals (i.e., one for each ear), one of which is coupled as indicated to the mixer 102 and the other of which is coupled to the mixer 104.

The multiple tap delay buffer 92 also has twelve additional taps for the twelve second order reflections which are coupled through amplitude scalers 95 to the inner-reverberation network 94 via a bus 96. These second order reflections are associated with the virtual sources contained in the virtual rooms that touch the junction of two walls in the model room as shown in FIGS. 4A, 4B, and 4C. The direction, time delay, and amplitude of each second order reflection is computed in the same manner as for first order reflections. The time delays are implemented in the same delay buffer 92 as the first order delays and the amplitude is scaled by the appropriate amount by amplitude scalers 95. The second order virtual sources shown in FIGS. 4A, 4B, and 4C are those having virtual sources numbered 2. The virtual room coordinates for those second order virtual sources (see FIGS. 4A, 4B, and 4C) are as follows: (1, 0, 1), (0, 1, 1), (−1, 0, 1), (0, −1, 1), (1, 1, 0), (−1, 1, 0), (−1, −1, 0), (1, −1, 0), (1, 0, −1), (0, 1, −1), (−1, 0, −1), (0, −1, −1).

The inner reverberation network 94 may be implemented in many configurations, however, the embodiment illustrated in FIG. 6 contains twelve reverberation units of the first type and six reverberation units of the second type. Each type 2 unit is associated with a reverberant stream emanating from a second order virtual room directly behind a first order room (i.e., rooms lined up along a perpendicular line from the center of each wall). For example, with reference to FIG. 4A the second order room with coordinates (2, 0, 0) is directly behind the first order room (1, 0, 0). Each type 1 unit is associated with a reverberation stream emanating from a fourth order virtual room directly behind the second order rooms (i.e., rooms lined up along a diagonal line from corners formed by intersection of two walls). For example, the fourth order room. shown in FIG. 4A, having the coordinates (2, 2, 0) is directly behind the second order room having the coordinates (1, 1, 0). Thus, the total 18 reverberation units are associated with regions of space for which they produce the correct reverberation stream. Each unit has four adjacent neighbors. For example, the reverberation stream implemented with a type 2 unit 112 (FIG. 6) and emanating from the second order virtual room having coordinates (2, 0, 0) is spatially adjacent (and thus feeds back to) to four reverberations streams implemented with type 1 units 113, 114, 115, and 116. These type 1 units are associated with the fourth order virtual rooms having the coordinates (2, 2, 0), (2, 0, 2), (2, −2, 0) and (2, 0, −2). As shown in FIG. 6, each type 2 unit (for example, unit 112) is fed back into the four spatially adjacent type 1 units. This feedback generates the reflections for the virtual rooms between those along the perpendicular lines and those along the diagonal lines.

The time delays for each unit are calculated on the basis of the dimensions of the model room, the illusory spatial position of the sound source, and illusory position of the listener in the simulated environment. The length of the two delay buffers in the type 2 reverberation units are taken from the time of arrival difference of the first and second order reflections and of the second and third order reflections respectively. For example, for the unit associated with the room having the coordinates (2, 0, 0), if T (2, 0, 0) is the predicted time of arrival for a virtual sound source from the virtual room, then the delay buffer lengths can be given as follows:

delay one =T (2, 0, 0) −T (1, 0, 0)

delay two =T (3, 0, 0) −T (2, 0, 0)

The time delays for the type 1 reverberation units are determined from the time of arrival difference of the second and fourth order reflections. For the unit associated with the virtual room having the coordinates (1, 1, 0), the delay length can be given as follows:

delay =T (2, 2, 0) −T (1, 1, 0)

The value of the coefficients used within the units to control feedback are calculated on the basis of the distance traveled by reflected sound for the computed delay, the sound absorption of the walls encountered in the sound path, the angle of reflection, and the absorption/reflection/diffusion properties of the simulated environment.

The resulting output streams from the inner reverberation network 94 are each coupled to a directionalizer 98 each with two outputs one of which is coupled to the mixing circuit 102 and one of which is coupled to the mixing circuit 104 as indicated in FIG. 5. For each of the directionalizers 98 associated with each reverberation stream the proper direction is determined by the position of the virtual sound source (indicated by the coordinates at the outputs in FIG. 6). The total mixed signals from mixers 102 and 104 are the two output sound signals which are then each coupled to a reproduction transducer or recorder.

The fully computerized embodiment shown in FIG. 2B uses known digital software implementations of the subsystems described and shown in FIGS. 5 and 6. A program written in the programming language C is provided in Appendix A for determining control parameters including scaling factors, azimuth, elevation, and delays based on input parameters specifying room dimensions, listener position and source position. Appendix B provides a table produced by this program of azimuth, elevation, delay and scale values for the rectangular room system with a listener position of (0, 0, 0), and a source position of 45° azimuth, 30° elevation and distance from listener of 2 meters.

A specific embodiments of the novel spatial reverberator have been described for the purpose of illustrating the manner in which the invention may be made and used. It should be understood that implementation of other variations and modifications of the invention in its various aspects will be apparent to those skilled in the art and that the invention is not limited thereto by the specific embodiment described. It is therefore contemplated to cover by the present invention any and all modifications, variations or equivalents that fall within the true spirit and scope of the underlying principles disclosed and claimed herein.

Appendix A.

```
/****** revmap.c ***********************************************************
 *
 *       Version 1.0
 *
 *   revmap.c      for use in setting up the spatio-temporal pattern
 *                   of reflections in spatial reverberation
 *
 *                   It calculates angles (az, el), delay and scaling for each
 *                   first and second order reflection and the same on just
 *                   those third and fourth order reflections paired with each
 *                 second order reflection in the reverberation units.
 *
 *       input parameters:
 *                   lx              - listener's x coordinate (meters)
 *                   ly              - listener's y coordinate
 *                   lz              - listener's z coordinate
 *                   rw              - width of simulated room (meters)
 *                   rl              - length of simulated room
 *                   rh              - height of simulated room
 *                   saz             - azimuth angle of source (degrees)
 *                   sel             - elevation angle of source (degrees)
 *                   sr              - source distance (meters)
 *
 *       output parameters:
 *                   az       - azimuth incidence angles (degrees)
 *                   el       - elevation incidence angles (degrees)
 *                   delay    - reflection latencies (sec)
 *                   scale    - amplitude scaling associated with delay
 *
```

```
*/

#include <stdio.h>
#include <math.h>

#define SPM .0034              /* msec per meter conversion        */
#define DPR 57.29578           /* degrees per radian conversion    */
#define TINY 1.0E-30           /* no zero dividing!                */
#define DIMX 0                 /* dimension number for x in map    */
#define DIMY 1                 /* dimension number for y in map    */
#define DIMZ 2                 /* dimension number for z in map    */
#define AZ 0                   /* first output argument            */
#define EL 1                   /* second output argument           */
#define DELAY 2                /* third output argument            */
#define SCALE 3                /* fourth output argument           */
#define REFDIST 1              /* reference distance for direct signal */

/* Set up maps of image rooms                                        */

        int map1[3][6]={0,0,1,0,-1,0,
                        0,1,0,-1,0,0,
                        1,0,0,0,0,-1};
        int map2[3][18]={0,0,1,0,-1,0,1,2,1,0,-1,-2,-1,0,1,0,-1,0,
                         0,1,0,-1,0,2,1,0,-1,-2,-1,0,1,1,0,-1,0,0,
                         2,1,1,1,1,0,0,0,0,0,0,0,0,-1,-1,-1,-1,-2};
        int map3[3][18]={0,0,2,0,-2,0,2,3,2,0,-2,-3,-2,0,2,0,-2,0,
                         0,2,0,-2,0,3,2,0,-2,-3,-2,0,2,2,0,-2,0,0,
                         3,2,2,2,2,0,0,0,0,0,0,0,0,-2,-2,-2,-2,-3};
        char ord[2][5]={"3rd:","4th:"};


main(narg,argv)
int narg;
char *argv[];
{
        float cvs(),
        float source[4],first[4],second[4],third[4], fdelay[6],
        float x,y,z,xs,ys,zs,xl,yl,zl,xr,yr,zr,r,sum,sum2,avg,sd,
        int ir,ix,iy,iz,i,j,k,iord;

    if (narg < 9) {
  fprintf(stderr,"USAGE: smap lx ly lz rw rl rh az el r [az el r . . .]0);
        exit(-1);
    }
    xl = atof(argv[1]),
    yl = atof(argv[2]);
    zl = atof(argv[3]);
    xr = atof(argv[4]),
    yr = atof(argv[5]);
    zr = atof(argv[6]);
    source[AZ] = atof(argv[7]);
    source[EL] = atof(argv[8]);
    r = atof(argv[9]);
    printf("Source0azimuth:%3.2f degrees0elevation:%3.2f degrees0distance:%3.2f meters0,source[AZ],source[EL],r);
    printf("Listener:%2.2f%2.2f%2.2f0,xl,yl,zl),
    printf("Room:%2.2f%2.2f%2.2f0,xr,yr,zr);

    xl *= SPM,                 /* SPM converts meters to seconds */
    yl *= SPM,
    zl *= SPM;
    xr *= SPM;
    yr *= SPM;
    zr *= SPM;


/*  Calculate direct signal characteristics then shift origin       */

    stoc(source[AZ],source[EL],atof(argv[9])*SPM,&xs,&ys,&zs);
    source[DELAY] = sqrt(xs*xs+ys*ys+zs*zs),     /* the direct sound path */
    printf("0xiyizorderazeldelayscale0);
    printf("000Src:%3.1f%3.1f:0000%.4f0,source[AZ],source[EL],
                REFDIST/r);
    printf("-----------------------------------------0);
```

```
    xs += xl;                                          /* shift origin      */
    ys += yl;                                          /* to room center    */
    zs += zl;

/*  Calculate coordinates of the image model virtual sources              */

    for (ir = 0; ir <= 5; ir++ ) {                        /* first order     */
       x = cvs(map1[DIMX][ir], xs, xr) - xl;
       y = cvs(map1[DIMY][ir], ys, yr) - yl;
       z = cvs(map1[DIMZ][ir], zs, zr) - zl;
       ctos(x,y,z,&first[AZ],&first[EL],&r);
       first[DELAY] = r - source[DELAY];
       fdelay[ir] = r;
       first[SCALE] = source[DELAY]/(source[DELAY]+first[DELAY]);
       printf("%d%d%d",map1[DIMX][ir],map1[DIMY][ir],map1[DIMZ][ir]);
       printf("1st %3.1f%3.1f% 4f% 4f0,
            first[AZ],first[EL],first[DELAY],first[SCALE]);
    }

    i = 0;
    for (ir = 0; ir <= 17; ir++ ) {                 /* second  & higher order */
     printf("----------------------------------------------0);
       x = cvs(map2[DIMX][ir], xs, xr) - xl;
       y = cvs(map2[DIMY][ir], ys, yr) - yl;
       z = cvs(map2[DIMZ][ir], zs, zr) - zl;

       ctos(x,y,z,&second[AZ],&second[EL],&r);
       second[DELAY] = r - source[DELAY];
       second[SCALE] = source[DELAY]/(source[DELAY]+second[DELAY]);
       printf("%d%d%d",map2[DIMX][ir],map2[DIMY][ir],map2[DIMZ][ir]);
       x = cvs(map3[DIMX][ir], xs, xr) - xl;
       y = cvs(map3[DIMY][ir], ys, yr) - yl;
       z = cvs(map3[DIMZ][ir], zs, zr) - zl;
       ctos(x,y,z,&third[AZ],&third[EL],&r);
       third[DELAY] = r - source[DELAY] - second[DELAY];
       third[SCALE] = (source[DELAY]+second[DELAY])/
               (source[DELAY] + r);
       iord = abs(map3[DIMX][ir]) + abs(map3[DIMY][ir]) +
               abs(map3[DIMZ][ir]) - 3;
       if (iord == 0 ) {
               second[DELAY] = second[DELAY] - fdelay[i];
               second[SCALE] = fdelay[i]/(fdelay[i]+second[DELAY]);
               i++;
          }
       printf("2nd %3.1f%3.1f% 4f% 4f0,
               second[AZ],second[EL],second[DELAY],second[SCALE]);
       printf("%d%d%d",map3[DIMX][ir],map3[DIMY][ir],map3[DIMZ][ir]);
       printf("%s% 4f% 4f0,
            ord[iord],third[DELAY],third[SCALE]);
     }
}

/****** ctos ********
 *
 *      Given the 3D Cartesian coordinates of a point, ctos calculates
 *      the angular postion of the point in a spherical coordinate system
 *      with 0 degrees azimuth situated at the +y axis and 0 degrees
 *      elevation at ear level.  ctos also returns the distance of
 *      point from the origin.
 *
 *      input parameters:
 *               x          - x coordinate of point
 *               y          - y coordinate of point
 *               z          - z coordinate of point
 *
 *      output parameters:
 *               az         - horizontal plane angle made with +y axis
 *               el         - vertical plane angle made with +y axis
 *               r          - radius from origin to point
 */
```

```
ctos(x,y,z,az,el,r)
float  x,y,z,*az,*el,*r;
{
        float  rad,

        *r  =  sqrt(  x*x  +  y*y  +  z*z  );
        *el  =  asin(  z/(*r)  )  *  DPR,
        if  (x  ==  0.)  x  =  TINY;
        rad  =  atan  (  y/x  );
        if  (x  >  0.)  *az  =  90  -  (  rad  *  DPR  );
        if  (x  <  0.)  *az  =  270.  -  (  rad  *  DPR  );
}

/******  stoc  ********
 *
 *        Given the angular postion of the point in a spherical coordinate
 *        system with 0 degrees azimuth situated at the +y axis and 0 degrees
 *        elevation at ear level and the distance of the point from the
 *        origin, stoc returns the 3D Cartesian coordinates of the point.
 *
 *        input parameters.
 *                  az        - horizontal plane angle made with +y axis
 *                  el        - vertical plane angle made with +y axis
 *                  r         - radius from origin to point
 *
 *        output parameters:
 *                  x         - x coordinate of point
 *                  y         - y coordinate of point
 *                  z         - z coordinate of point
 */

stoc(az,el,r,x,y,z)
float  az,el,r,*x,*y,*z;
{
        *z  =  sin  (  el/DPR  )  *  r;
        r  =  sqrt  (  r*r  -  (*z)*(*z)  );                    /* horizontal radius */
        *x  =  cos  (  (90.  -  az)  /DPR  )  *  r;
        *y  =  sin  (  (90.  -  az)  /DPR  )  *  r;
}

/******  cvs  ********
 *
 *        ic - image room coordinate
 *        cs - coordinate of source (rel. to room center)
 *        cr - room measure on the dimension passed
 *        vs - coordinate of virtual source
 */

float  cvs(ic,cs,cr,vs)

        int  ic;
        float  cs,cr,vs;
{
        if  (ic  ==  0)  vs  =  cs;
        else  {
                if  ((  abs(ic)  %  2)  !=  1)  vs  =  cs;
                else  vs  =  -cs;
                vs  =  (float)ic  *  cr  +  vs;
        }
        return(vs),
}
```

Appendix B

Source
azimuth: 45.00 degrees
elevation: 30.00 degrees
distance: 2.00 meters
Listener: 0.00 1.00 −1.00
Room: 5.00 6.00 7.00

| ix | iy | iz | order | az | el | delay | scale | |
|---|---|---|---|---|---|---|---|---|
| 0 | 0 | 0 | Src: | 45.0 | 30.0 | .0000 | 0.5000 | |
| 0 | 0 | 1 | 1st: | 45.0 | 77.8 | 0.0210 | 0.2443 | |
| 0 | 1 | 0 | 1st: | 23.8 | 18.2 | 0.0041 | 0.6262 | |
| 1 | 0 | 0 | 1st: | 72.0 | 14.1 | 0.0071 | 0.4886 | |
| 0 | −1 | 0 | 1st: | 172.4 | 6.1 | 0.0250 | 0.2137 | |
| −1 | 0 | 0 | 1st: | 281.1 | 9.0 | 0.0150 | 0.3114 | |
| 0 | 0 | −1 | 1st: | 45.0 | −73.9 | 0.0144 | 0.3203 | |
| 0 | 0 | 2 | 2nd: | 45.0 | 83.4 | 0.0167 | 0.6249 | Type 2 delay_a |
| 0 | 0 | 3 | 3rd: | | | 0.0237 | 0.6274 | Type 2 delay_b |
| 0 | 1 | 1 | 2nd: | 23.8 | 69.2 | 0.0223 | 0.2338 | |
| 0 | 2 | 2 | 4th: | | | 0.0390 | 0.3883 | Type 1 delay |
| 1 | 0 | 1 | 2nd: | 72.0 | 63.6 | 0.0236 | 0.2240 | |
| 2 | 0 | 2 | 4th: | | | 0.0335 | 0.4299 | Type 1 delay |
| 0 | −1 | 1 | 2nd: | 172.4 | 40.7 | 0.0349 | 0.1630 | |
| 0 | −2 | 2 | 4th: | | | 0.0212 | 0.5983 | Type 1 delay |
| −1 | 0 | 1 | 2nd: | 281.1 | 51.6 | 0.0279 | 0.1959 | |
| −2 | 0 | 2 | 4th: | | | 0.0245 | 0.5257 | Type 1 delay |
| 0 | 2 | 0 | 2nd: | 5.3 | 4.3 | 0.0276 | 0.2822 | Type 2 delay_a |
| 0 | 3 | 0 | 3rd: | | | 0.0052 | 0.7900 | Type 2 delay_b |
| 1 | 1 | 0 | 2nd: | 53.7 | 12.0 | 0.0095 | 0.4174 | |
| 2 | 2 | 0 | 4th: | | | 0.0428 | 0.2473 | Type 1 delay |
| 2 | 0 | 0 | 2nd: | 83.8 | 5.1 | 0.0178 | 0.4384 | Type 2 delay_a |
| 3 | 0 | 0 | 3rd: | | | 0.0086 | 0.7145 | Type 2 delay_b |
| 1 | −1 | 0 | 2nd: | 157.7 | 5.7 | 0.0273 | 0.1997 | |
| 2 | −2 | 0 | 4th: | | | 0.0190 | 0.5694 | Type 1 delay |
| 0 | −2 | 0 | 2nd: | 173.5 | 5.3 | −0.0016 | 1.0527 | Type 2 delay_a |
| 0 | −3 | 0 | 3rd: | | | 0.0353 | 0.4677 | Type 2 delay_b |
| −1 | −1 | 0 | 2nd: | 214.0 | 5.1 | 0.0312 | 0.1790 | |
| −2 | −2 | 0 | 4th: | | | 0.0094 | 0.7013 | Type 1 delay |
| −2 | 0 | 0 | 2nd: | 277.9 | 6.4 | 0.0017 | 0.9286 | Type 2 delay_a |
| −3 | 0 | 0 | 3rd: | | | 0.0251 | 0.4872 | Type 2 delay_b |
| −1 | 1 | 0 | 2nd: | 294.0 | 8.3 | 0.0166 | 0.2903 | |
| −2 | 2 | 0 | 4th: | | | 0.0306 | 0.3848 | Type 1 delay |
| 0 | 1 | −1 | 2nd: | 23.8 | −63.2 | 0.0161 | 0.2975 | |
| 0 | 2 | −2 | 4th: | | | 0.0403 | 0.3266 | Type 1 delay |
| 1 | 0 | −1 | 2nd: | 72.0 | −56.5 | 0.0177 | 0.2780 | |
| 2 | 0 | −2 | 4th: | | | 0.0341 | 0.3743 | Type 1 delay |
| 0 | −1 | −1 | 2nd: | 172.4 | −32.8 | 0.0308 | 0.1806 | |
| 0 | −2 | −2 | 4th: | | | 0.0199 | 0.5849 | Type 1 delay |
| −1 | 0 | −1 | 2nd: | 281.1 | −43.4 | 0.0229 | 0.2290 | |
| −2 | 0 | −2 | 4th: | | | 0.0238 | 0.4924 | Type 1 delay |
| 0 | 0 | −2 | 2nd: | 45.0 | −82.4 | 0.0166 | 0.5619 | Type 2 delay_a |
| 0 | 0 | −3 | 3rd: | | | 0.0237 | 0.5941 | Type 2 delay_b |

What is claimed is:

1. Sound processing apparatus for creating illusory sound sources in three dimensional space comprising:

means for providing audio signals;

reverberation means for generating at least one reverberant stream of signals from the audio signals to simulate a desired configuration of reflected sound; and, directionalizing means for applying to at least part of one reverberant stream a spectral directional cue to generate at least one output signal.

2. The apparatus of claim 1 wherein a plurality of reverberant streams are generated by the reverberation means and wherein the directionalizing means applies a directionalizing transfer function to each reverberant stream to generate a plurality of directionalized reverberant streams from each reverberant stream, and further comprises output means for producing a plurality of output signals each output signal comprising the sum of a plurality of directionalized reverberant streams each derived from a different reverberant stream.

3. The apparatus of claim 1 wherein each reverberant stream includes at least one direct sound component and wherein the spectral directional cue is superimposed on the direct sound component.

4. The apparatus of claim 2 further comprising filter means for filtering at least one directionalized reverberant stream.

5. The apparatus of claim 3 wherein at least one part of one reverberant stream is emphasized.

6. The apparatus of claim 2 further comprising scaling means for scaling the audio signals to simulate sound absorption.

7. The apparatus of claim 2 further comprising filter means for filtering the audio signals to simulate sound absorption.

8. The apparatus of claim 2 wherein the reverberation means comprises scaling filter means for simulating sound absorption of reverberant sound reflections.

9. The apparatus of claim 2 wherein the reverberation means comprises first recirculating delay means, having a delay buffer and feedback control, for generating reverberant signals from audio signals.

10. The apparatus of claim 9 wherein the reverberation means comprises second recirculating delay means, having two delay buffers and a common feedback, for generating reverberant signals from audio signals.

11. The apparatus of claim 10 wherein the reverberation means further comprises a plurality of first and second recirculating delay means configured in parallel with a least one second recirculating delay means feeding back to at least one first recirculating delay means.

12. The apparatus of claim 1 further comprising means for controlling the reverberation means and directionalizing means responsive to input control signals including means to independently control presence and definition.

13. The apparatus of claim 1 wherein the directionalizing means further comprises means for dynamically changing the spectral directional cues to simulate sound source and listener motion.

14. The apparatus of claim 2 wherein each reverberant stream simulates reflections from a selected spatial region and wherein each said reverberant stream is directionalized to provide the illusion of emanating from said selected region.

15. The sound processing apparatus of claim 1 wherein the configuration of reflected sound is dynamically changed and wherein the directionalizing means further comprises means for modifying the spectral directional cues responsive to the dynamic changes of the configuration of reflected sound.

16. The sound processing apparatus of claim 2 wherein the plurality of directionalizing reverberant streams are generated such that they simulate the reflection pattern of a model room.

17. The sound processing apparatus of claim 13 wherein the reverberation means comprises means for modifying the configuration of reflected sound in response to changes in the spectral directional cues.

18. The sound processing apparatus of claim 17 wherein the directionalizing means further comprises means for generating a dynamic spectral directional cue to simulate source motion.

19. The sound processing apparatus of claim 17 wherein the directionalizing means further comprises means for generating the dynamic directionalizing transfer functions to simulate listener motion.

20. A method for processing input audio signals to generate output reverberant streams at an output, comprising the steps of:

combining the input audio signals with a first feedback signal to produce a first combined signal;

providing delay and feedback control of the combined signal to produce a delayed signal and providing delay and feedback control of the delayed signal to produce a dual delayed signal;

utilizing the dual delayed signal as the first feedback signal; and, combining at the output the dual delayed signal and the delayed signal to produce an output reverberant stream having a recurring pattern of reverberation with two different delays.

21. A spatial reverberation system for simulating the spatial and temporal dimensions of reverberant sound, comprising:

means for processing audio signals utilizing a spectral directional cue to produce at least one directionalized audio stream including reverberant audio signals providing a selected spatio-temporal distribution of illusory reflected sound; and, means for outputting the audio stream.

22. The spatial reverberation system of claim 21 wherein the means for processing utilizes pinna cues to produce the directionalized audio stream.

23. The spatial reverberation system of claim 21 wherein the means for processing further comprises means for dynamically changing the spatio-temporal distribution.

24. The spatial reverberation system of claim 21 wherein the means for processing further comprises means for controlling sound definition and sound presence independently.

25. Reverberation apparatus comprising:

means for providing audio signals;

means for generating and outputting a plurality of different reverberation streams responsive to the audio signals wherein at least a first reverberant stream is separately and independently fed to a second one of said reverberant streams and utilized to generate said second one of said reverberant streams which is utilized exclusively as an output stream which is fed back to another one of said reverberant streams other than said first reverberant stream.

26. The apparatus of claim 25 wherein the means for generating further comprises means for delay and feedback to produce a reverberant stream.

27. The apparatus of claim 26 further comprising means for dual delay and feedback to produce a reverberant stream having a recurring pattern of reverberation with two different delays.

28. The apparatus of claim 25 further comprising directionalizing means for applying spectral directional cues to at least one of the plurality of different reverberant streams.

29. The apparatus of claim 25 wherein the means for generating comprises modelling means for generating the plurality of unique reverberant streams so as to simulate a calculated reflection pattern of a selected model room.

30. The apparatus of claim 29 wherein the modelling means comprises means for generating and directionalizing each different reverberant stream so as to simulate directionality and calculated reflection delays of a respective section of the selected model room.

31. The apparatus of claim 29 wherein the model room may be a room of any size.

32. A method for processing input audio signals to generate reverberant streams, comprising the steps of:

combining the input audio signals with a first feedback signal to produce a first combined signal;

providing delay and feedback control of the combined signal to produce a delayed signal and providing delay and feedback control of the delayed signal to produce a dual delayed signal;

utilizing the dual delayed signal as the first feedback signal;

combining the dual delayed signal and the delayed signal to produce a first reverberant stream having a recurring pattern of reverberation with two different delays, combining the input audio signal and a second feedback signal to produce a second combined signal;

providing delay and feedback control of the second combined signal to produce a second reverberant stream; and, utilizing the second reverberant stream as the second feedback signal.

33. The method of claim 32 wherein the step of combining with the first feedback signal further comprises the step of combining the input audio signal with the second reverberant stream, and wherein the step of combining with the second feedback signal further comprises the step of combining the input audio signal with the first reverberant stream.

34. The method of claim 33 further comprising the step of dynamically varying the recurring pattern in a continuous manner.

35. The method of claim 32 further comprising the step of dynamically varying the delay and feedback control to continuously vary the recurring pattern of reverberation.

36. Sound processing apparatus comprising:

means for input of source audio signals;

reverberation means for generating at least one reverberant stream of signals comprising delayed source audio signals to simulate a desired configuration of reflected sounds;

first directionalizing means for applying to at least part of said one reverberant stream a directionalizing transfer function to generate at least one directionalized reverberant stream; and means for combining at least said one directionalized reverberant stream and the source audio signal, which is not directionalized by the first directionalizing means, to generate an output signal.

37. The sound processing apparatus of claim 36 further comprising second directionalizing means for applying a directionalizing transfer function to the source audio signal.

38. Sound processing apparatus for modelling of a selected model room comprising:

means for providing audio signals means responsive to the audio signals for producing a plurality of reverberant streams comprising a plurality of simulated reflections with calculated delay times and with each reverberant stream directionalized with calculated spectral directional cues so as to simulate time of arrival and direction of arrival base upon calculated values determined for the selected model room and selected source and listener locations within the model room.

39. The sound processing apparatus of claim 38 wherein a plurality of first and second order simulated reflections are delayed and directionalized based directly upon calculated values for the model room and any higher order simulated reflections have arrival times based upon the model room and are directionalized so as to simulate arrival from a calculated region of the model room.

40. The sound processing apparatus of claim 38 further comprising means for dynamically changing the delay times and directional cues to permit continuous change of source and listener location within the model room and continuous change in the dimensions of the model room.

41. Reverberation apparatus comprising:

means for providing audio signals;

means for generating and outputting a plurality of different reverberation streams responsive to the audio signals wherein at least a first reverberant stream is separately and independently fed to a second one of said reverberant streams and utilized to generate said second one of said reverberant streams which is utilized exclusively as an output stream which is fed back to another one of said reverberant streams other than said first reverberant stream, and wherein the means for generating comprises means having an input for generating at least one of said reverberant streams by producing a delayed and a dual delayed signal responsive to the audio signals with two different delay paths and feeding back only the dual delayed signal to the input and for combining the delayed and the dual delayed signal to produce the one of said reverberant streams.

42. A method of processing sound signals comprising of steps of:

generating at least one reverberant stream of audio signals simulating a desired configuration of reflected sounds; and, superimposing at least one spectral directional cue on at least part of one reverberant stream.

43. The method of claim 42 wherein the step of generating comprises generating at least one direct sound component as part of at least one reverberant stream.

44. The method of claim 42 further comprising the step of filtering at least one of the reverberant streams.

45. The method of claim 42 further comprising the step of emphasizing at least part of one reverberant stream.

46. The method of claim 42 wherein the step of generating further comprising the step of filtering during generation of the reverberant stream to simulate sound absorption.

47. The method of claim 42 further comprising the step of dynamically changing the spectral directional cues to simulate sound source and listener motion.

* * * * *

UNITED STATES PATENT AND TRADEMARK OFFICE
CERTIFICATE OF CORRECTION

PATENT NO. : 4,731,848

DATED : March 15, 1988

INVENTOR(S) : Gary Kendall, et al.

It is certified that error appears in the above-identified patent and that said Letters Patent is hereby corrected as shown below:

Column 1, line 7, change "bother" to --both--.

Column 1, line 8, change "threee" to --three--.

Column 4, line 49, change "such as way" to --such a way--.

Column 5, line 30, change "this is assumption" to --this assumption--.

Column 10, line 10, change "4A. 4B" to --4A, 4B--.

Column 10, line 62, change "room. shown" to --room, shown--.

Column 12, line 27, change "embodiments" to --embodiment--.

Signed and Sealed this

Eighth Day of August, 1989

*Attest:*

DONALD J. QUIGG

*Attesting Officer*

*Commissioner of Patents and Trademarks*